(12) United States Patent
Chung et al.

(10) Patent No.: US 11,800,688 B2
(45) Date of Patent: Oct. 24, 2023

(54) HEAT DISSIPATION STRUCTURE AND ELECTRONIC DEVICE INCLUDING SAME

(71) Applicant: Samsung Electronics Co., Ltd., Gyeonggi-do (KR)

(72) Inventors: Haein Chung, Gyeonggi-do (KR); Kyungha Koo, Gyeonggi-do (KR); Seungjae Bae, Gyeonggi-do (KR); Hyunjoong Yoon, Gyeonggi-do (KR); Jaeho Chung, Gyeonggi-do (KR); Yongwon Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 118 days.

(21) Appl. No.: 17/289,285

(22) PCT Filed: Nov. 1, 2019

(86) PCT No.: PCT/KR2019/014730
§ 371 (c)(1),
(2) Date: Apr. 28, 2021

(87) PCT Pub. No.: WO2020/091514
PCT Pub. Date: May 7, 2020

(65) Prior Publication Data
US 2021/0392787 A1  Dec. 16, 2021

(30) Foreign Application Priority Data

Nov. 1, 2018  (KR) ........................ 10-2018-0132936

(51) Int. Cl.
*H05K 7/20* (2006.01)
*G06F 1/20* (2006.01)
(52) U.S. Cl.
CPC ......... *H05K 7/20509* (2013.01); *G06F 1/203* (2013.01); *H05K 7/20336* (2013.01)

(58) Field of Classification Search
CPC ............ H05K 7/20509; H05K 7/20336; H01L 23/427; G06F 1/203
See application file for complete search history.

(56) References Cited

U.S. PATENT DOCUMENTS 8,159,821 B2  4/2012  Tan et al.
9,175,911 B2  11/2015  Huang
(Continued)

FOREIGN PATENT DOCUMENTS

JP       2011258831 A     12/2011
KR    10-0513010 B1        9/2005
(Continued)

OTHER PUBLICATIONS

Korean Office Action dated Apr. 28, 2023.

*Primary Examiner* — Mandeep S Buttar
*Assistant Examiner* — Yahya Ahmad
(74) *Attorney, Agent, or Firm* — Cha & Reiter, LLC

(57) ABSTRACT

An embodiment of the present invention discloses a heat dissipation structure and an electronic device including the heat dissipation structure, the heat dissipation structure comprising: at least one heat dissipation plate; at least one rigid plate which forms an opening in one area and is coupled to the upper portion of the at least one heat dissipation plate to support durability of the at least one heat dissipation plate; at least one heat pipe of which at least a portion is accommodated in the opening formed by the at least one rigid plate and is coupled to an area of the at least one heat dissipation plate that faces the at least one heat pipe; and at least one fixing tool which supports the fixing between the at least one heat dissipation plate and the at least one rigid plate. In addition, various embodiments identified through the specification are possible.

12 Claims, 12 Drawing Sheets

(56) References Cited

U.S. PATENT DOCUMENTS

| | | | |
|---|---|---|---|
| 9,568,254 B2 | 2/2017 | Huang | |
| 9,976,813 B2 | 5/2018 | Yu et al. | |
| 2007/0195489 A1* | 8/2007 | Lai | G11C 5/143 |
| | | | 361/600 |
| 2007/0215319 A1 | 9/2007 | Chen et al. | |
| 2009/0135566 A1* | 5/2009 | Choi | H05K 7/20963 |
| | | | 361/720 |
| 2009/0273904 A1* | 11/2009 | Chung | F28D 15/0233 |
| | | | 165/104.26 |
| 2011/0139399 A1* | 6/2011 | Itakura | H01L 21/67109 |
| | | | 165/185 |
| 2011/0157831 A1* | 6/2011 | Nie | H01L 23/4006 |
| | | | 411/103 |
| 2012/0305221 A1* | 12/2012 | Huang | F28D 15/0275 |
| | | | 165/185 |
| 2017/0108286 A1 | 4/2017 | Huang | |
| 2017/0295640 A1* | 10/2017 | Tsunoda | H05K 9/0032 |

FOREIGN PATENT DOCUMENTS

| | | |
|---|---|---|
| KR | 10-2011-0011492 A | 2/2011 |
| KR | 10-1595212 B1 | 2/2016 |
| KR | 10-2016-0062456 A | 6/2016 |
| KR | 10-1896877 B1 | 9/2018 |

* cited by examiner

HEAT DISSIPATION STRUCTURE AND ELECTRONIC DEVICE INCLUDING SAME

CROSS REFERENCE TO RELATED APPLICATIONS

This application is a National Phase Entry of PCT International Application No. PCT/KR2019/014730, which was filed on Nov. 1, 2019, and claims a priority to Korean Patent Application No. 10-2018-0132936, which was filed on Nov. 1, 2018, the contents of which are incorporated herein by reference.

TECHNICAL FIELD

Various embodiments of the disclosure described herein relate to a heat dissipation structure for suppressing heat generation of an electronic part, and an electronic device including the same.

BACKGROUND ART

With evolution of an electronic device into a medium in which various functions are integrated, various electronic parts assisting in operation of the functions are equipped in the electronic device. Correspondingly, the electronic device is designed in a structure aiming for high density to solve an internal space limitation and accommodate the various electronic parts.

The electronic parts may generate heat when processing data at high speed or processing a large amount of data, and as described above, the various electronic parts may be arranged in a mutually airtight structure. Therefore, heat generated from some of the electronic parts may not only cause damage to the corresponding electronic parts or deterioration in functions thereof, but may also affect other electronic parts adjacent thereto through heat convection, heat conduction, or the like. Accordingly, in a region adjacent to an electronic part predicted to generate heat, a heat dissipation structure may be disposed to dissipate the heat to the outside.

DISCLOSURE

Technical Problem

The heat dissipation structure may include a thin heat dissipation plate and a rigid reinforcement plate providing durability to the heat dissipation plate. For example, the heat dissipation plate and the reinforcement plate may be bonded through a reflow soldering process. However, when the degrees of thermal expansion of the heat dissipation plate and the reinforcement plate differ from each other in the reflow soldering process, initially designed bonding points may be changed, which may cause a deflection phenomenon of the heat dissipation structure by hindering airtight bonding between the heat dissipation plate and the reinforcement plate.

Various embodiments of the disclosure provide a heat dissipation structure for ensuring flatness by suppressing a change of a bonding point and deformation of the heat dissipation structure by implementing constraint between a heat dissipation plate and a reinforcement plate, and an electronic device including the same.

Technical Solution

A heat dissipation structure according to an embodiment includes at least one heat dissipation plate, at least one rigid plate that has an opening formed in one region thereof and that is bonded to an upper portion of the at least one heat dissipation plate to support durability of the at least one heat dissipation plate, at least one heat pipe, at least part of which is received in the opening formed by the at least one rigid plate, the at least one heat pipe being bonded with one region of the at least one heat dissipation plate that faces the at least one heat pipe, and at least one fixing tool that assists in fixing the at least one heat dissipation plate and the at least one rigid plate to each other.

An electronic device according to an embodiment includes a housing, a printed circuit board disposed in one region inside the housing, a processor mounted on one region of the printed circuit board, a shield can that shields at least part of the processor, and a heat dissipation structure that is disposed adjacent to the processor and that dissipates heat conducted from the processor. The heat dissipation structure includes at least one heat dissipation plate, at least one rigid plate that has an opening formed in one region thereof and that is bonded to an upper portion of the at least one heat dissipation plate to support durability of the at least one heat dissipation plate, at least one heat pipe, at least part of which is received in the opening formed by the at least one rigid plate, the at least one heat pipe being bonded with one region of the at least one heat dissipation plate that faces the at least one heat pipe, and at least one fixing tool that assists in fixing the at least one heat dissipation plate and the at least one rigid plate to each other.

Advantageous Effects

According to the various embodiments, by ensuring the flatness of the heat dissipation structure, efficient space design in the electronic device equipped with the heat dissipation structure may be produced, and an assembly tolerance between structures may be prevented.

In addition, the disclosure may provide various effects that are directly or indirectly recognized.

DESCRIPTION OF DRAWINGS

With regard to the description of the drawings, identical or similar reference numerals may be used to refer to identical or similar components.

MODE FOR INVENTION

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

Figure 1:
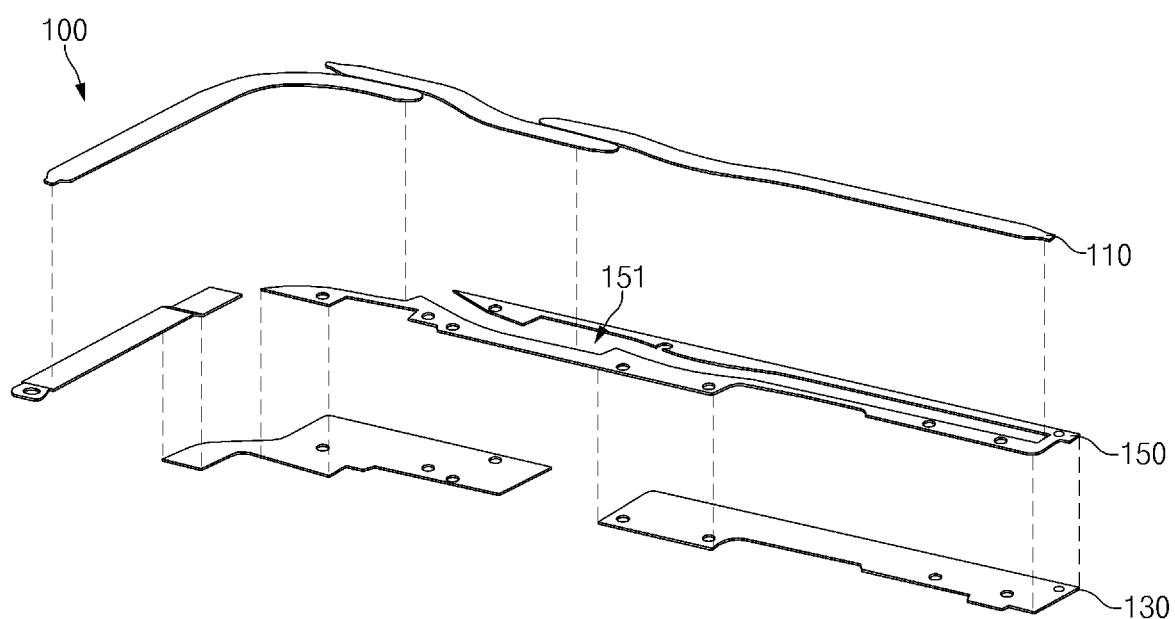
FIG. 1 is a view illustrating a heat dissipation structure according to an embodiment.

FIG. 1 is a view illustrating a heat dissipation structure according to an embodiment.

Referring to FIG. 1, the heat dissipation structure 100 according to the embodiment may be disposed adjacent to a heat-generating object (e.g., an electronic part) and may suppress overheating of the heat-generating object. For example, the heat dissipation structure 100, at least part of which is brought into contact with the heat-generating object, may receive, through conduction, heat generated when the heat-generating object is operated and may dissipate the heat to the outside, thereby preventing overheating of the heat-generating object and damage or malfunction due to the overheating. In this regard, the heat dissipation structure 100 may include at least one heat pipe 110, at least one heat-dissipation reinforcement plate 130, and at least one rigid reinforcement plate 150. According to various embodiments, the heat dissipation structure 100 may omit at least one of the aforementioned components, or may additionally include other component(s). For example, the heat dissipation structure 100 may further include at least one fixing tool that will be mentioned below. For example, the fixing tool may physically fix the heat-dissipation reinforcement plate 130 and the rigid reinforcement plate 150 to each other. According to the fixing tool, in a manufacturing process or an operating environment of the heat dissipation structure 100, the relative positions of the heat-dissipation reinforcement plate 130 and the rigid reinforcement plate 150 may be constrained, and shape deformation (e.g., a bend of at least a partial region) may be suppressed. Accordingly, functional efficiency of the heat dissipation structure 100 may be improved.

The heat pipe 110 may dissipate at least part of heat conducted from the heat-generating object to the outside, or may transfer the heat to another component. In this regard, one region of the heat pipe 110 may be brought into contact with the heat-generating object through a specified medium (e.g., a thermal interface material (TIM)), and an inner space corresponding to a place brought into contact with the heat-generating object may include liquid (e.g., water, alcohol, or the like). According to an embodiment, vapor of the liquid vaporized by the heat conducted from the heat-generating object may dissipate at least part of the heat to the outside while flowing into another space, or may transfer the heat to another component (e.g., the heat-dissipation reinforcement plate 130) brought into contact with the heat pipe 110. The vapor flowing into the other space, for example, may be liquefied into liquid according to the heat dissipation or the heat transfer, and the liquefied liquid may be returned to the inner space, which corresponds to the place brought into contact with the heat-generating object, by a capillary action.

The heat-dissipation reinforcement plate 130 may assist in the heat dissipation of the heat pipe 110. For example, the heat-dissipation reinforcement plate 130 may be soldered to one region of the heat pipe 110 and may dissipate, to the outside, at least part of heat transferred from the heat pipe 110 through at least one solder. Alternatively, the heat-dissipation reinforcement plate 130 may transfer at least part of the heat transferred from the heat pipe 110 to another soldered component (e.g., the rigid reinforcement plate 150). According to an embodiment, at least part of the heat-dissipation reinforcement plate 130 may contain a material (e.g., copper (Cu)) having excellent thermal conductivity and may be formed of a thin film in relation to slimness of an electronic device to which the heat dissipation structure 100 is applied. In various embodiments, the heat-dissipation reinforcement plate 130 may be disposed as the lowest layer of the heat dissipation structure 100. In this regard, to support or cover at least part of another component (e.g., the rigid reinforcement plate 150), the heat-dissipation reinforcement plate 130 may include a width, length, or area similar to, or corresponding to, that of the other component.

The heat-dissipation reinforcement plate 150 may reinforce the durability of the heat dissipation structure 100. In this regard, the rigid reinforcement plate 150 may receive at least part of the heat pipe 110 in a state of being seated on at least part of the heat-dissipation reinforcement plate 130. For example, the rigid reinforcement plate 150 may include, in one region thereof, an opening 151 having a shape corresponding to the heat pipe 110 and may receive and surround at least part of the heat pipe 110 through the opening 151. Alternatively, depending on a shape in which the heat pipe 110 is implemented, the rigid reinforcement plate 150 may receive and surround part of the heat pipe 110 through the opening 151 while supporting another part of the heat pipe 110 through one region. In other words, the heat pipe 110 may be seated on a structure formed by the rigid reinforcement plate 150 and the heat-dissipation reinforcement plate 130 such that at least part of the heat pipe 110 is surrounded by the rigid reinforcement plate 150 or is supported while being surrounded by the rigid reinforcement plate 150. According to an embodiment, after the heat pipe 110 is seated, at least part between the rigid reinforcement plate 150 and the heat-dissipation reinforcement plate 130 and at least part between the heat pipe 110 and the heat-dissipation reinforcement plate 130 may be soldered by a specified process, and accordingly the rigid reinforcement plate 150 may reinforce the durability of the heat pipe 110 and the heat-dissipation reinforcement plate 150. In various embodiments, at least part of the rigid reinforcement plate 150 may contain a material (e.g., aluminum (Al)) having excellent durability and thermal conductivity, and a partial region of the rigid reinforcement plate 150 may be omitted depending on the shape of the heat pipe 110 or the heat-dissipation reinforcement plate 130.

According to an embodiment, the rigid reinforcement plate 150 and the heat-dissipation reinforcement plate 130 may be physically fixed to each other through a specified fixing tool before the soldering between the components of the heat dissipation structure 100. This will be described through a manufacturing process of the heat dissipation structure 100 to be described below.

Figure 2A:
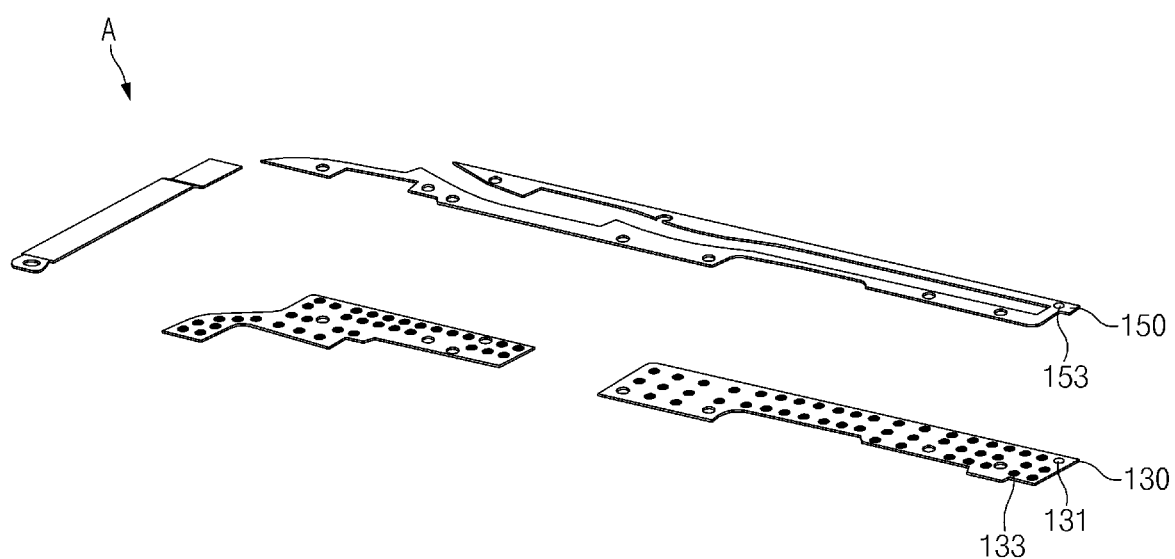
FIG. 2A is a view illustrating a first bonding process between components of the heat dissipation structure according to an embodiment.
Figure 2B:
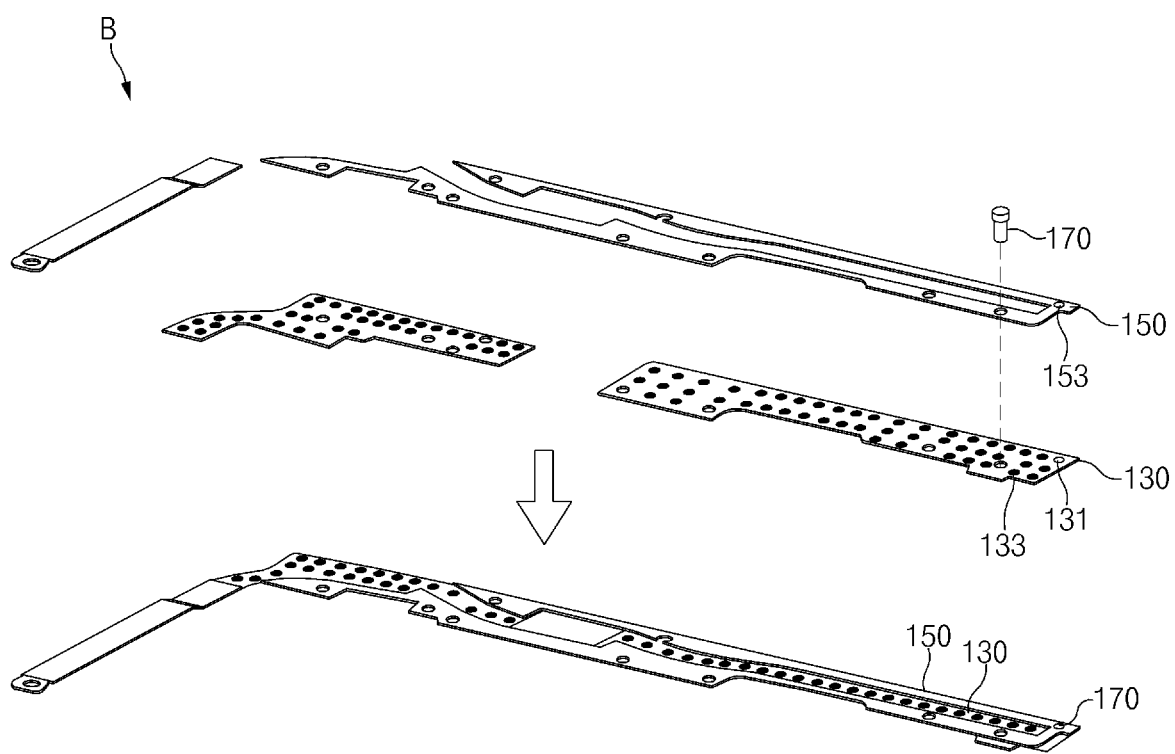
FIG. 2B is a view illustrating a second bonding process between the components of the heat dissipation structure according to an embodiment.
Figure 2C:
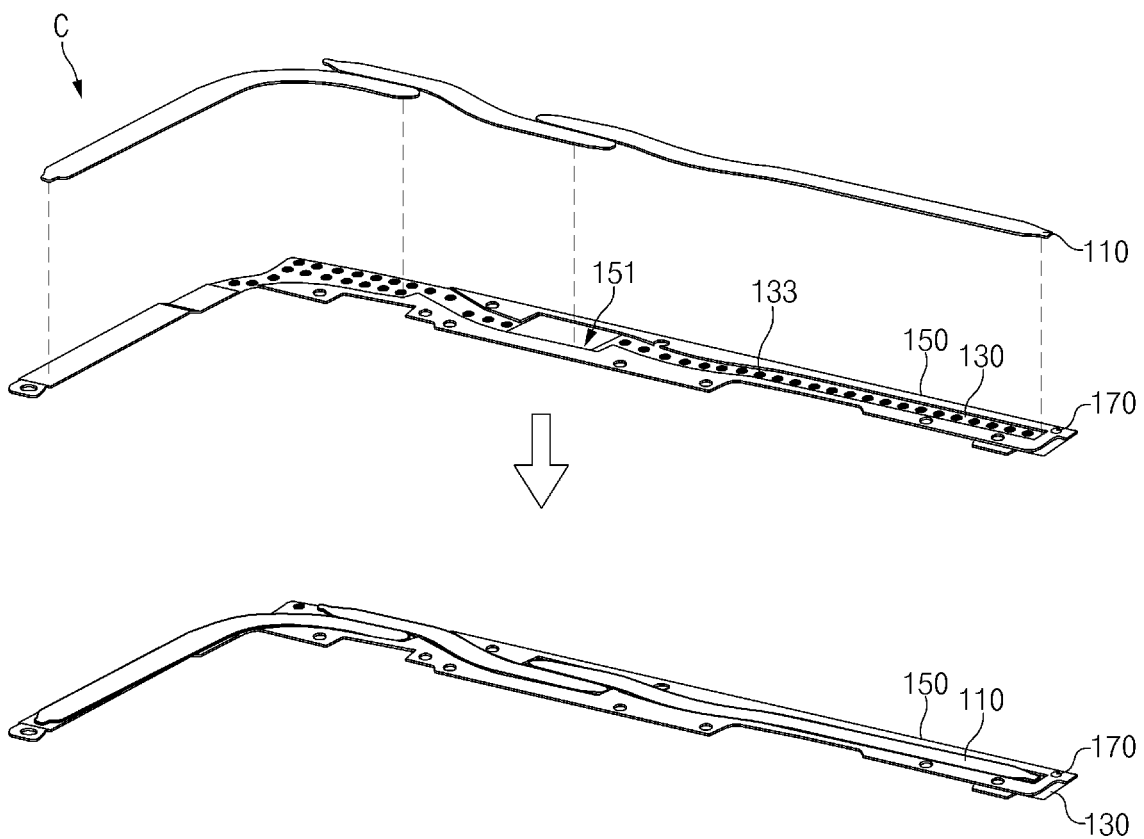
FIG. 2C is a view illustrating a third bonding process between the components of the heat dissipation structure according to an embodiment.
Figure 2D:
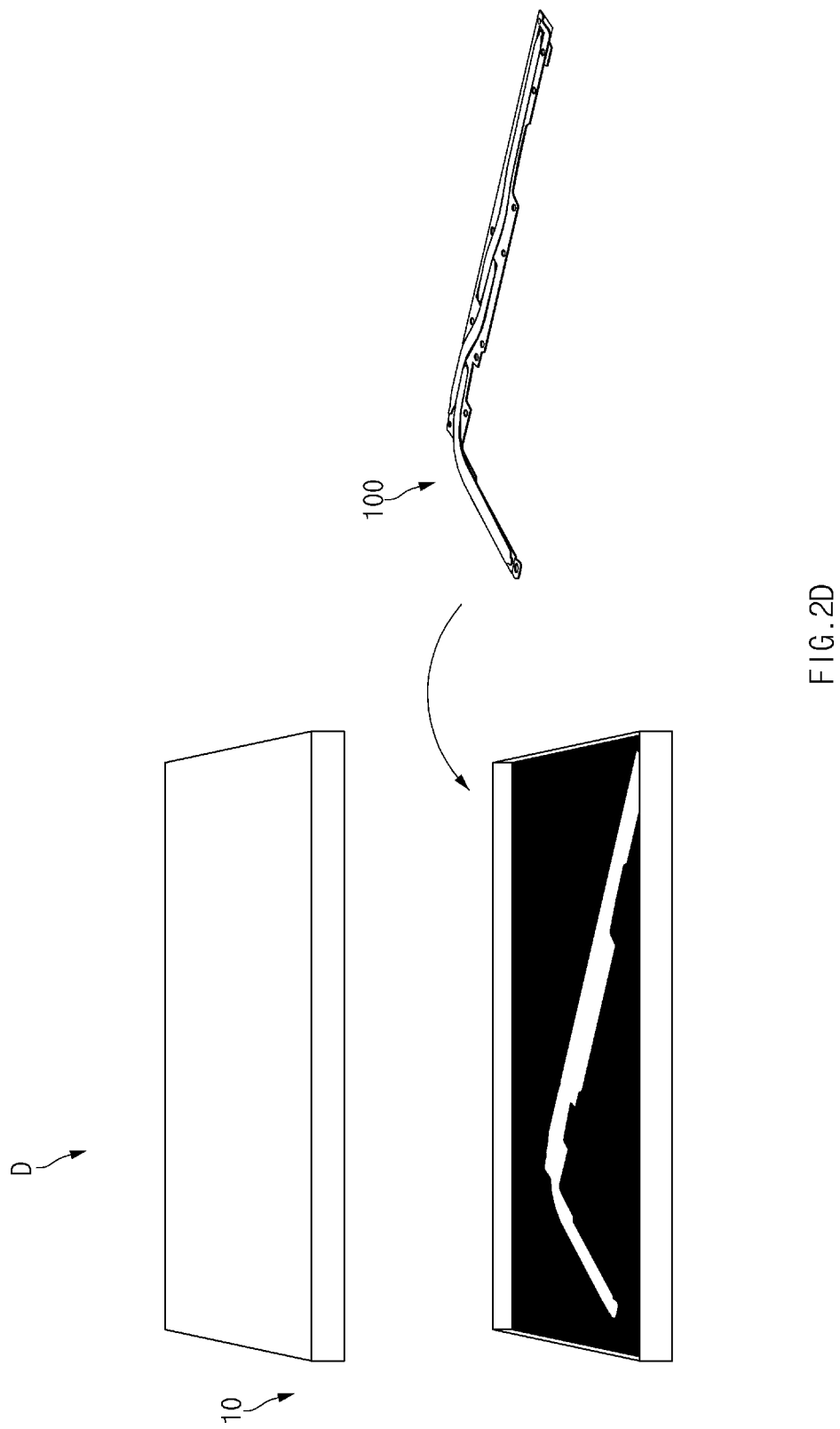
FIG. 2D is a view illustrating a fourth bonding process between the components of the heat dissipation structure according to an embodiment.
Figure 2E:
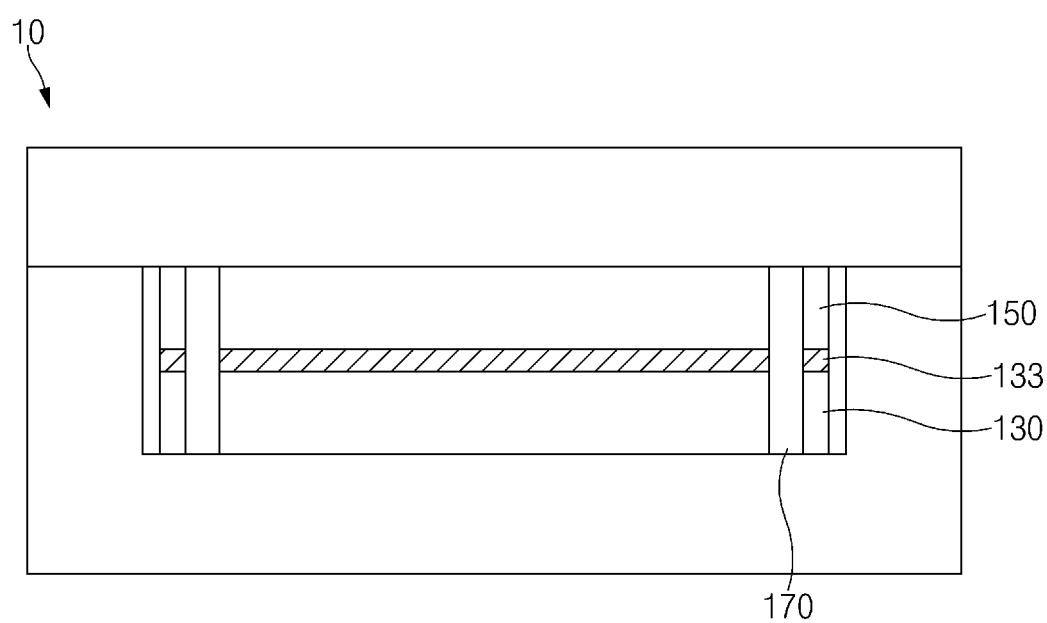
FIG. 2E is a schematic view illustrating a state of the heat dissipation structure in the fourth bonding process according to an embodiment.

FIGS. 2A to 2D are views illustrating various bonding processes between components of the heat dissipation structure according to an embodiment, and FIG. 2E is a schematic view illustrating a state of the heat dissipation structure in a fourth bonding process according to an embodiment.

Referring to FIG. 2A, in a first manufacturing process A, at least one insertion opening that assists in physically fixing the rigid reinforcement plate 150 and the heat-dissipation reinforcement plate 130 to each other may be formed in each of the rigid reinforcement plate 150 and the heat-dissipation reinforcement plate 130. For example, at least one first insertion opening 153 having a form (e.g., a void) passing through the rigid reinforcement plate 150 may be formed in one region of the rigid reinforcement plate 150. Correspondingly, at least one second insertion opening 131 having a form (e.g., a void or a recess) that passes through the heat-dissipation reinforcement plate 130 or is concavely formed on the heat-dissipation reinforcement plate 130 to a predetermined depth may be formed in a region of the heat-dissipation reinforcement plate 130 that corresponds to the first insertion opening 153 when the rigid reinforcement plate 150 and the heat-dissipation reinforcement plate 130 are stacked on each other. In various embodiments, the first insertion opening 153 and the second insertion opening 131 may be formed in the manufacture of plates (e.g., the rigid reinforcement plate 150 and the heat-dissipation reinforcement plate 130), or may be formed through a separate drilling process, and may include the same or similar size.

According to an embodiment, in the first manufacturing process A, at least one solder 133 that assists in soldering the heat-dissipation reinforcement plate 130 and the rigid reinforcement plate 150 may be additionally formed in another region of the heat-dissipation reinforcement plate 130. For example, the solder 133 may be formed in a region of the heat-dissipation reinforcement plate 130 that does not overlap the at least one second insertion opening 131. In various embodiments, the solder 133 may be formed by coating the heat-dissipation reinforcement plate 130 with a separate layer including a patterned solder, or may be formed by regularly or irregularly applying a liquid solder to the heat-dissipation reinforcement plate 130.

Referring to FIG. 2B, in a second manufacturing process B, the rigid reinforcement plate 150 and the heat-dissipation reinforcement plate 130 may be fixed by a fixing tool 170. In an embodiment, the fixing tool 170 may include a rivet. In this case, the fixing tool 170 may pass, in a heated state, through the first insertion opening 153 (e.g., a void) formed in the rigid reinforcement plate 150 and the second insertion opening 131 (e.g., a void) formed in the heat-dissipation reinforcement plate 130, and thereafter opposite longitudinal end regions of the fixing tool 170 may be bucked to fix the plates (e.g., the rigid reinforcement plate 150 and the heat-dissipation reinforcement plate 130) to each other. In another embodiment, the fixing tool 170 may include an anchor bolt. In this case, the first insertion opening 153 (e.g., a void) formed in the rigid reinforcement plate 150 and the second insertion opening 131 (e.g., a void) formed in the heat-dissipation reinforcement plate 130 may each include a screw thread on an inner surface thereof, and the fixing tool 170 may be threaded into the first insertion opening 153 and the second insertion opening 131 to fix the plates (e.g., the rigid reinforcement plate 150 and the heat-dissipation reinforcement plate 130) to each other.

Referring to FIG. 2C, in a third manufacturing process C, the heat pipe 110 may be seated on the structure of the rigid reinforcement plate 150 and the heat-dissipation reinforcement plate 130 that are physically fixed to each other by the fixing tool 170. For example, the heat pipe 110 may be seated such that at least part thereof is received in the opening 151 formed in the rigid reinforcement plate 150 and is surrounded by the rigid reinforcement plate 150. Alternatively, the heat pipe 110 may be seated such that one part is received in the opening 151 and surrounded by the rigid reinforcement plate 150 and another part is supported by the rigid reinforcement plate 150. According to an embodiment, when the heat pipe 110 is seated on the structure of the rigid reinforcement plate 150 and the heat-dissipation reinforcement plate 130, one region of the heat pipe 110 may make contact with, or closely approach, the at least one solder 133 on the heat-dissipation reinforcement plate 130 through the opening 151 formed in the rigid reinforcement plate 150.

Referring to FIGS. 2D and 2E, in a fourth manufacturing process D, a reflow soldering process may be performed on the heat dissipation structure 100 in the state in which the heat pipe 110 of FIG. 2C is seated on the structure of the rigid reinforcement plate 150 and the heat-dissipation reinforcement plate 130. For example, the heat dissipation structure 100 may be placed in a jig assembly 10 having a shape corresponding to the heat dissipation structure 100, and heat at a temperature at which the at least one solder 133 formed on the heat-dissipation reinforcement plate 130 is liquefied may be supplied to the jig assembly 10. Accordingly, the at least one solder 133 may be liquefied to viscously attach one region of the rigid reinforcement plate 150 and one region of the heat-dissipation reinforcement plate 130 that face each other and to viscously attach one region of the heat pipe 110 and an opposite region of the heat-dissipation reinforcement plate 130 that face each other through the opening 151 of FIG. 2 that is formed in the rigid reinforcement plate 150. When the heat dissipation structure 100 is separated from the jig assembly 10 or cold air is supplied to the jig assembly 10 to cool the liquid solder 133, the one region of the rigid reinforcement plate 150 and the one region of the heat-dissipation reinforcement plate 130 may be soldered, and the one region of the heat pipe 110 and the opposite region of the heat-dissipation reinforcement plate 130 may be soldered.

In the above-described reflow soldering process, the relative positions of the rigid reinforcement plate 150 and the heat-dissipation reinforcement plate 130 may be constrained by the specified fixing tool 170 (e.g., a rivet, an anchor bolt, or the like) before the at least one solder 133 is liquefied. In this regard, in a case where the constraint between the rigid reinforcement plate 150 and the heat-dissipation reinforcement plate 130 by the fixing tool 170 is excluded, the rigid reinforcement plate 150 and the heat-dissipation reinforcement plate 130 may expand in sizes corresponding to coefficients of thermal expansion of the corresponding plates when heat is supplied to the jig assembly 10. When the rigid reinforcement plate 150 and the heat-dissipation reinforcement plate 130 have different coefficients of thermal expansion, one of the rigid reinforcement plate 150 and the heat-dissipation reinforcement plate 130 may expand in a smaller or larger size than the other. Accordingly, the alignment between the rigid reinforcement plate 150 and the heat-dissipation reinforcement plate 130 may be released, and initially designed bonding points between the rigid reinforcement plate 150 and the heat-dissipation reinforcement plate 130 may be changed. Due to this, at least one of the rigid reinforcement plate 150 or the heat-dissipation reinforcement plate 130 may be curved (or, deflected) when the rigid reinforcement plate 150 and the heat-dissipation reinforcement plate 130 are contracted, and therefore heat dissipation efficiency of the heat dissipation structure 100 may be reduced, or an assembly tolerance on the electronic device to which the heat dissipation structure 100 is applied may be caused.

Considering this, the rigid reinforcement plate 150 and the heat-dissipation reinforcement plate 130 may be constrained by the at least one fixing tool 170 before the reflow soldering process is performed on the heat dissipation structure 100 according to the embodiment of the disclosure. Accordingly, in the reflow soldering process, different expansion of the rigid reinforcement plate 150 and the heat-dissipation reinforcement plate 130, release of initial alignment, and a change of boding points may be suppressed, and thus the flatness of the heat dissipation structure 100 may be ensured.

Figure 3:
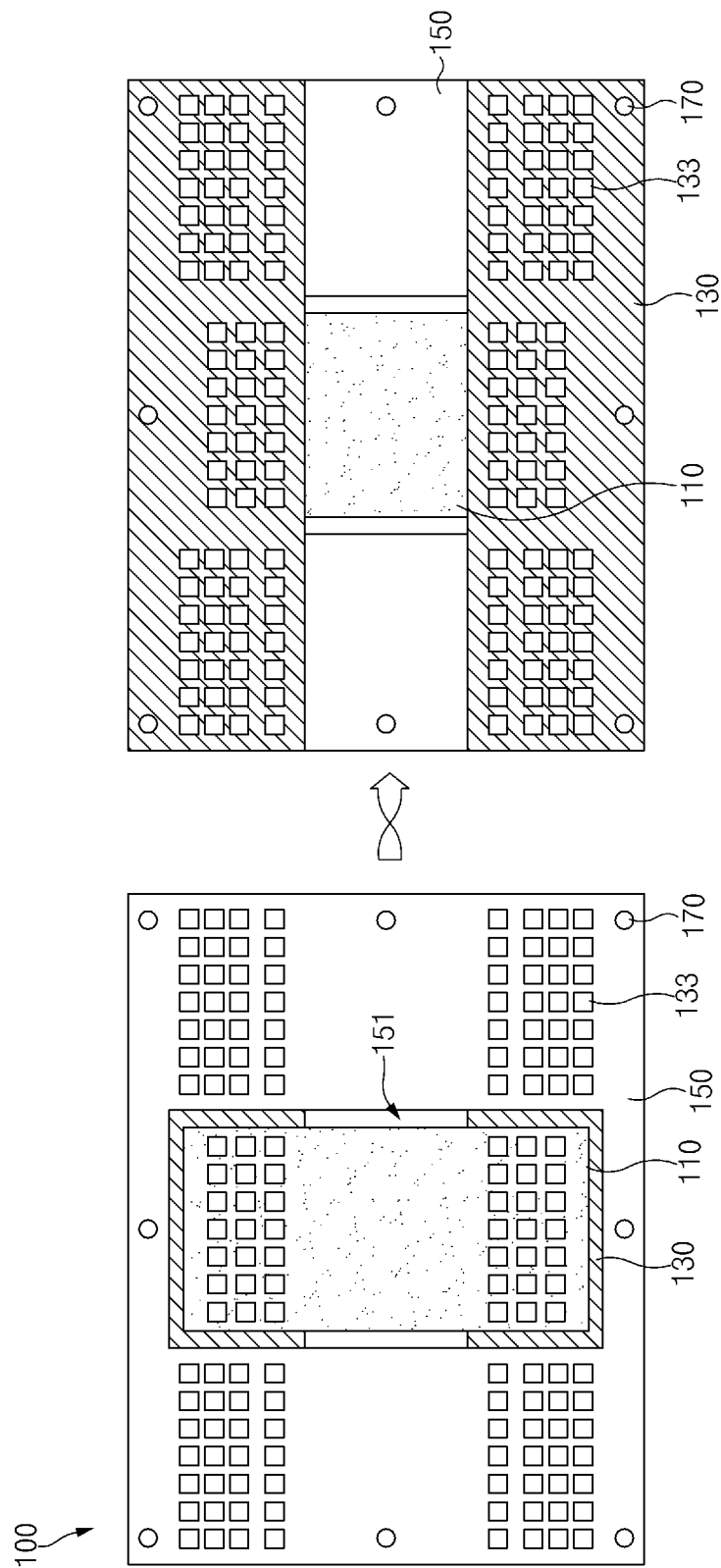
FIG. 3 is a schematic view illustrating a structure of the heat dissipation structure according to an embodiment.

FIG. 3 is a schematic view illustrating a structure of the heat dissipation structure according to an embodiment.

Referring to FIG. 3, the heat dissipation structure 100 may include the at least one rigid reinforcement plate 150, the at least one heat-dissipation reinforcement plate 130 disposed under the rigid reinforcement plate 150, and the at least one heat pipe 110, at least part of which is received in the opening formed in the rigid reinforcement plate 150. In an embodiment, the rigid reinforcement plate 150 and the heat-dissipation reinforcement plate 130 may be mechanically constrained through the specified fixing tool 170 (e.g., a rivet, an anchor bolt, or the like) in the state of being stacked such that at least parts of edge regions thereof correspond to each other. For example, one region of the heat-dissipation reinforcement plate 130 that does not overlap the at least one solder 133 formed on the heat-dissipation reinforcement plate 130 and one region of the rigid reinforcement plate 150 that corresponds to the one region of the heat-dissipation reinforcement plate 130 during the stacking may be constrained through the fixing tool 170. In this state, one region of the rigid reinforcement plate 150 and one region of the heat-dissipation reinforcement plate 130 may be soldered by using part of the solder 133, and one region of the heat pipe 110 seated such that at least part thereof is received in the opening 151 formed in the rigid reinforcement plate 150 and an opposite region of the heat-dissipation reinforcement plate 130 that faces the one region of the heat pipe 110 may be soldered by using another part of the solder 133.

According to an embodiment, fixed (or, constrained) regions of the rigid reinforcement plate 150 and the heat-dissipation plate 130 through the fixing tool 170 may be designed in edge regions of the rigid reinforcement plate 150 and the heat-dissipation plate 130 at a specified separation interval. According to another embodiment, the fixed regions of the rigid reinforcement plate 150 and the heat-dissipation plate 130 through the fixing tool 170 may be designed to alternate with the solder 133 formed on the heat-dissipation reinforcement plate 130. For example, the fixed regions of the rigid reinforcement plate 150 and the heat-dissipation reinforcement plate 130 may be designed in a region between a first solder and a second solder on the same line.

Figure 4A:
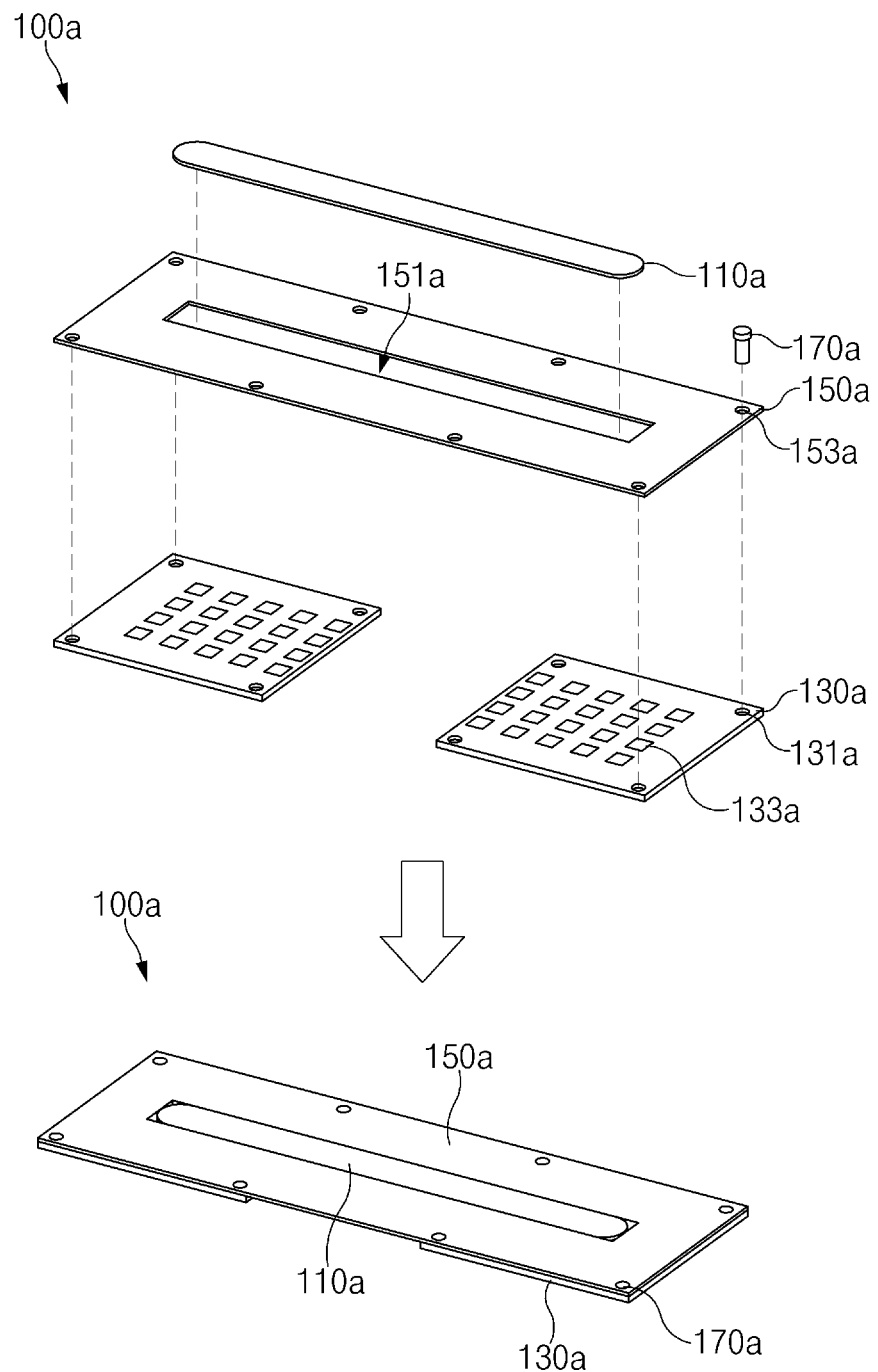
FIG. 4A is a view illustrating a heat dissipation structure according to another embodiment.
Figure 4B:
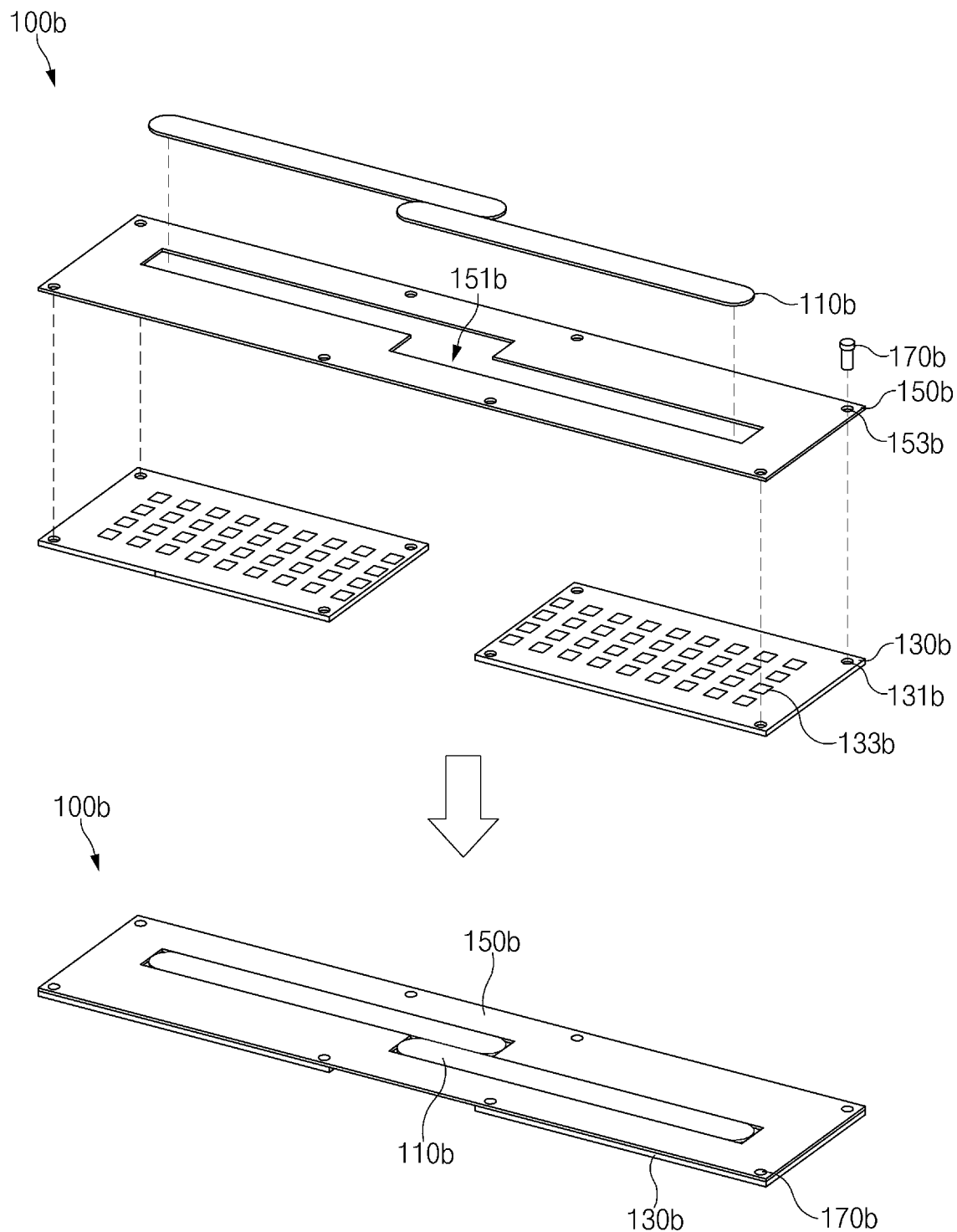
FIG. 4B is a view illustrating a heat dissipation structure according to another embodiment.
Figure 4C:
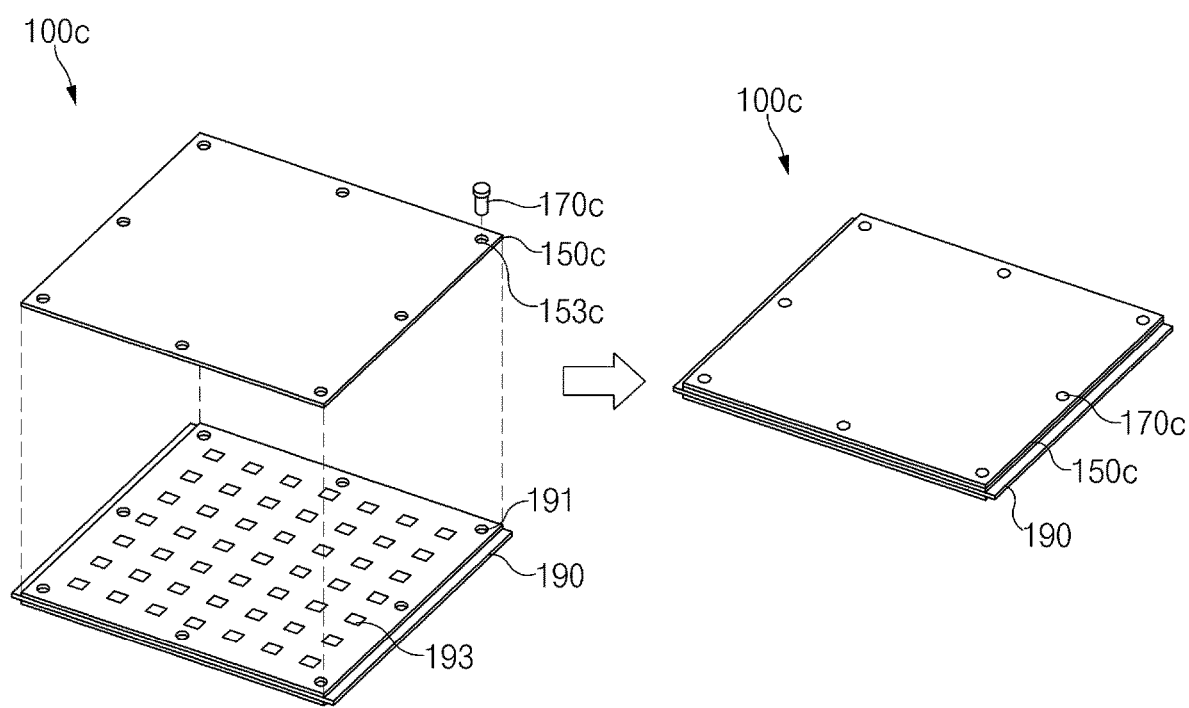
FIG. 4C is a view illustrating a heat dissipation structure according to another embodiment.

FIGS. 4A to 4C are views illustrating heat dissipation structures according to various embodiments.

The heat dissipation structures of the various embodiments to be described with reference to FIGS. 4A to 4C may include components at least partially identical or similar to those of the above-described heat dissipation structure (e.g., the heat dissipation structure 100 of FIG. 1 or 3), or may include a bonding structure between the at least partially identical or similar components. Repetitive descriptions will hereinafter be omitted.

Referring to FIGS. 4A and 4B, a heat dissipation structure 100a or 100b according to another embodiment may include at least one rigid reinforcement plate 150a or 150b, at least one heat-dissipation reinforcement plate 130a or 130b, and at least one heat pipe 110a or 110b. According to an embodiment, the rigid reinforcement plate 150a or 150b and the heat-dissipation reinforcement plate 130a or 130b may be mechanically constrained through at least one specified fixing tool 170a or 170b (e.g., a rivet, an anchor bolt, or the like) in a state of being stacked such that at least parts of edge regions thereof correspond to each other. In this regard, a third insertion opening 131a or 131b and a fourth insertion opening 153a or 153b that assist in penetration or fastening of the fixing tool 170a or 170b may be formed in one region of the heat-dissipation reinforcement plate 130a or 130b and one region of the rigid reinforcement plate 150a or 150b corresponding to the one region of the heat-dissipation reinforcement plate 130a or 130b during the stacking, respectively. According to an embodiment, the heat pipe 110a or 110b may be seated on the structure of the rigid reinforcement plate 150a or 150b and the heat-dissipation reinforcement plate 130a or 130b that are mutually constrained based on the penetration or fastening of the fixing tool 170a or 170b for the third insertion opening 131a or 131b and the fourth insertion opening 153a or 153b. For example, the heat pipe 110a or 110b may be seated such that at least part thereof is received in an opening 151a or 151b formed in the rigid reinforcement plate 150a or 150b and at least part of an edge region is surrounded by the rigid reinforcement plate 150a or 150b.

According to an embodiment, to improve efficiency of heat conduction (e.g., heat conduction from an internal heating space to a heat dissipation space), the heat pipe 110a or 110b may include a bar shape extending in a lengthwise direction. In this regard, the heat pipe 110a or 110b may be implemented with a single heat pipe structure (e.g., 110a) having the bar shape, or may be implemented in a structure (e.g., 110b) in which a plurality of heat pipes having the bar shape are arranged adjacent to each other. For example, the plurality of heat pipes may include mutually corresponding shapes and may be arranged adjacent to each other such that at least parts thereof are brought into contact with each other.

In an embodiment, when the heat pipe 110a or 110b is seated on the structure of the rigid reinforcement plate 150a or 150b and the heat-dissipation reinforcement plate 130a or 130b, a reflow soldering process using at least one solder 133a or 133b formed in one region of the heat-dissipation reinforcement plate 130a or 130b (e.g., a region not overlapping the third insertion opening 131a or 131b) may be performed. According to the reflow soldering process, one region of the rigid reinforcement plate 150a or 150b and one region of the heat-dissipation reinforcement plate 130a or 130b that face each other in the stacked state may be soldered, and similarly, one region of the heat pipe 110a or 110b and an opposite region of the heat-dissipation reinforcement plate 130a or 130b that face each other through the opening 151a or 151b of the rigid reinforcement plate 150a or 150b may be soldered.

Referring to FIG. 4C, a heat dissipation structure 100c according to another embodiment may include a vapor chamber 190 and a rigid reinforcement plate 150c. According to various embodiments, the vapor chamber 190 may function similarly to the above-described heat pipe (the heat pipe 110 of FIG. 1 or 3). For example, the vapor chamber 190 may include liquid (e.g., water, alcohol, or the like) in an inner space corresponding to a place brought into contact with a heat-generating object (e.g., an electronic part), and when the liquid is vaporized by heat conducted from the heat-generating object and flows into another space, at least part of the heat may be dissipated to the outside.

According to an embodiment, the vapor chamber 190 may include at least one fifth insertion opening 191 (e.g., a recess) formed in one region in a manufacturing process of the vapor chamber 190 and may include at least one solder 193 having a regular or irregular pattern in another region not overlapping the fifth insertion opening 191. Correspondingly, at least one sixth insertion opening 153c (e.g., a void) may be included in a region of the rigid reinforcement plate 150c that corresponds to the fifth insertion opening 191 of the vapor chamber 190 when the vapor chamber 190 and the rigid reinforcement plate 150c are stacked such that at least parts of edge regions thereof correspond to each other (or, are aligned with each other). According to various embodiments, the rigid reinforcement plate 150c may include a shape identical or similar to the shape of the vapor chamber 190. Alternatively, the rigid reinforcement plate 150c may include a shape having a larger area than the vapor chamber 190, or may include a shape in which a partial region (e.g., a central region) is open to a predetermined size to increase the externally exposed area of the vapor chamber 190 in relation to heat dissipation efficiency of the vapor chamber 190.

According to an embodiment, a specified fixing tool 170c (e.g., a welding rod) may be disposed through the fifth insertion opening 191 and the sixth insertion opening 153c. For example, the fixing tool 170c may pass through the sixth insertion opening 153c and may be inserted into at least part of the fifth insertion opening 191. The fixing tool 170c disposed through the fifth insertion opening 191 and the sixth insertion opening 153c may be cooled after molten through resistance welding, and accordingly the region of the fifth insertion opening 191 formed in the vapor chamber 190 and the region of the sixth insertion opening 153c formed in the rigid reinforcement plate 150c may be physically bonded. In this process, the at least one solder 193 formed on the vapor chamber 190 may not be liquefied due to a melting point different from that of the fixing tool 170c.

In an embodiment, the vapor chamber 190 and the rigid reinforcement plate 150c bonded based on the melting and cooling of the fixing tool 170c may be soldered by a reflow soldering process using the at least one solder 193 formed on the vapor chamber 190.

Figure 5:
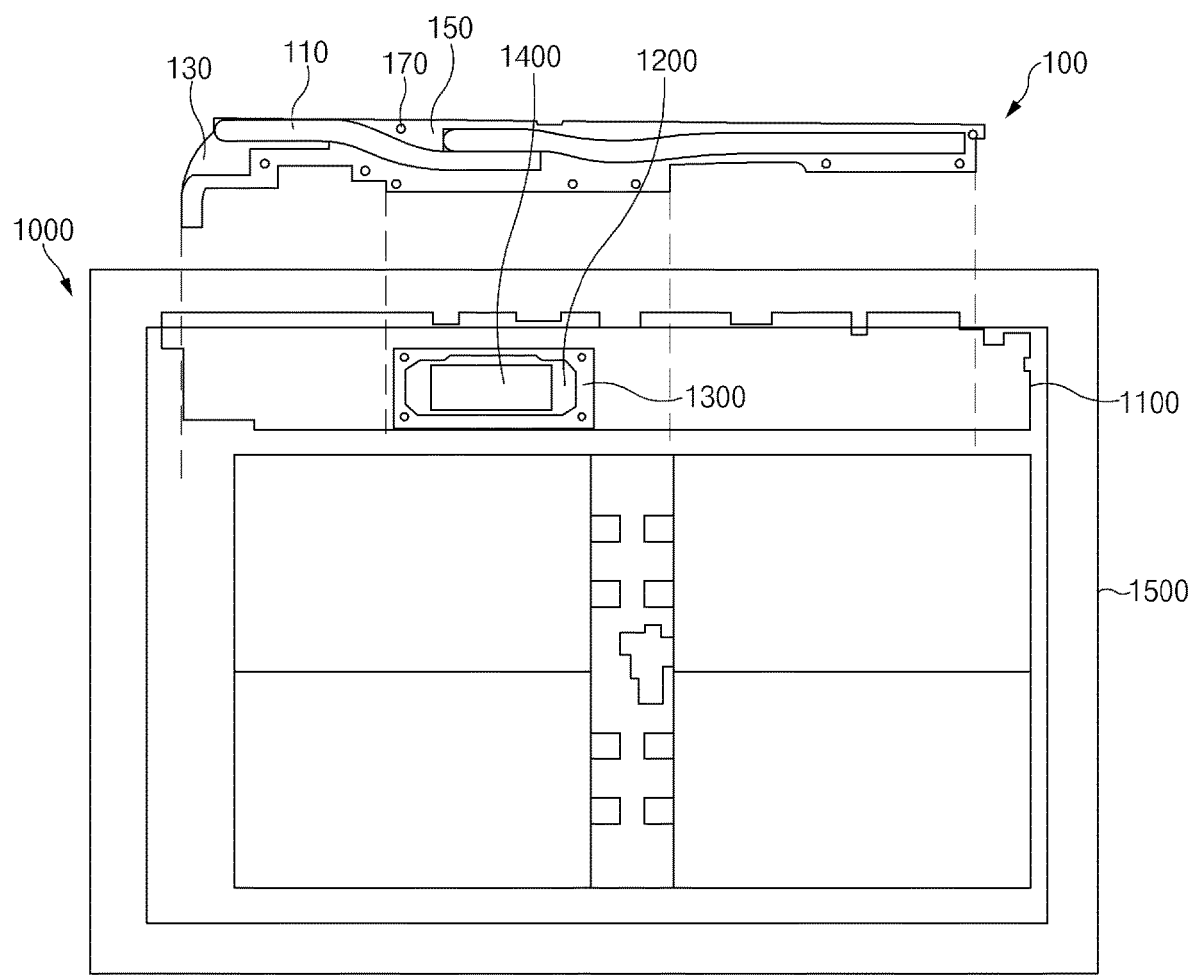
FIG. 5 is a view illustrating an electronic device including a heat dissipation structure according to an embodiment.
Figure 6:
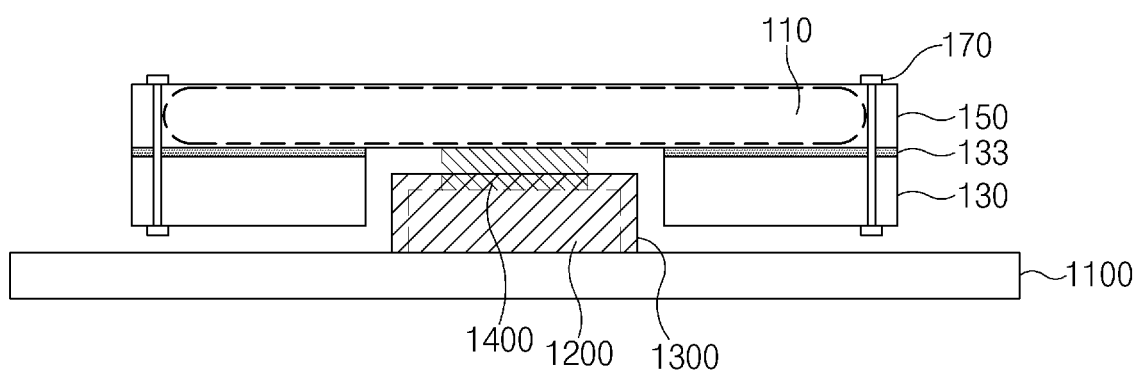
FIG. 6 is a schematic view illustrating a contact structure between the heat dissipation structure and an electronic part according to an embodiment.

FIG. 5 is a view illustrating an electronic device including a heat dissipation structure according to an embodiment, and FIG. 6 is a schematic view illustrating a contact structure between the heat dissipation structure and an electronic part according to an embodiment.

Referring to FIGS. 5 and 6, the above-described heat dissipation structure (e.g., 100 of FIG. 1 or 3, 100a of FIG. 4A, or 100b of FIG. 4B, hereinafter, collectively referred to as reference numeral 100) may be included in the electronic device 1000 and may assist in operation of resources of the electronic device 1000. For example, the heat dissipation structure 100 may be disposed adjacent to a specific electronic part equipped in the electronic device 1000 and may dissipate heat conducted from the electronic part to the outside. In this regard, the electronic device 1000 may include a printed circuit board 1100, a processor 1200, and a shield can 1300. In an embodiment, the aforementioned components may be received in a housing 1500 that forms at least part of a body of the electronic device 100. In various embodiments, the electronic device 1000 may omit at least one of the aforementioned components, or may additionally include other component(s). For example, the electronic device 1000 may further include a communication module that assists in communication with at least one external device, a memory that stores at least one piece of data or at least one instruction associated with a functional operation of the electronic device 1000, a display that assists in output of various pieces of contents, a battery that supplies driving power to the components, and the like.

At least one electronic part or element associated with operating a function of the electronic device 1000 may be mounted on the printed circuit board 1100. For example, the processor 1200 including at least one of a central processing unit, an application processor, a graphic processing unit, an image signal processor, a sensor hub processor, or a communication processor may be mounted on the printed circuit board. In an embodiment, at least part of the processor 1200 may be embedded in the shield can 1300. For example, in the state of being mounted on the printed circuit board 1100, the processor 1200 may be at least partially shielded from the outside by the shield can 1300 including an opening having a predetermined size. The shield can 1300, for example, may shield electromagnetic waves generated when the electronic device 1000 is operated, or may remove noise generated from the printed circuit board 1100.

According to an embodiment, a heat conduction member 1400 (a thermal interface material) that assists in dissipation of heat of the processor 1200 may be disposed in an inner space of the shield can 1300. For example, the heat conduction member 1400 may assist in heat conduction from the processor 1200 to the heat dissipation structure 100 disposed adjacent to the processor 1200.

In an embodiment, one region of the heat conduction member 1400 may be brought into contact with the processor 1200, and an opposite region of the heat conduction member 1400 may be brought into contact with a heat pipe 110 of the heat dissipation structure 100. In this regard, the heat dissipation structure 100 may include a heat-dissipation reinforcement plate 130, a rigid reinforcement plate 150 soldered to an upper portion of the heat-dissipation reinforcement plate 130 through part of a solder 133 formed on the heat-dissipation reinforcement plate 130, the heat pipe 110 that is at least partially received in an opening included in the rigid reinforcement plate 150 and is soldered to the heat-dissipation reinforcement plate 130 through another part of the solder 133, and a fixing tool 170 that mechanically constrains (or, fixes) the heat-dissipation reinforcement plate 130 and the rigid reinforcement plate 150 to each other.

According to an embodiment, the heat dissipation structure 100 may be disposed over the processor 1200. In this regard, to avoid overlapping the shield can 1300 in which the processor 1200 is received or to assist in contact between the heat pipe 110 and the heat conduction member 1400 making contact with the processor 1200 and extending outside the shield can 1300, the heat-dissipation reinforcement plate 130 may be implemented with a plurality of heat-dissipation reinforcement plates 130 spaced apart from each other by a predetermined distance. Alternatively, the heat-dissipation reinforcement plate 130 may be implemented in a single structure and may include a space concavely formed on a central region thereof to a predetermined depth, and an opening for insertion of the heat conduction member 1400 may be formed in a region of the heat-dissipation reinforcement plate 130 that corresponds to the concave space.

A heat dissipation structure according to the various embodiments described above may include at least one heat dissipation plate, at least one rigid plate that has an opening formed in one region thereof and that is bonded to an upper portion of the at least one heat dissipation plate to support durability of the at least one heat dissipation plate, at least one heat pipe, at least part of which is received in the opening formed by the at least one rigid plate, the at least one heat pipe being bonded with one region of the at least one heat dissipation plate that faces the at least one heat pipe, and at least one fixing tool that assists in fixing the at least one heat dissipation plate and the at least one rigid plate to each other.

According to various embodiments, the at least one heat dissipation plate may include at least one solder that assists in bonding the at least one heat dissipation plate with at least one of the at least one rigid plate or the at least one heat pipe.

According to various embodiments, the at least one rigid plate may include the opening corresponding to a shape of the at least one heat pipe.

According to various embodiments, the heat pipe may be disposed such that one region is received in the opening and an opposite region is supported by the rigid plate.

According to various embodiments, the at least one fixing tool may include at least one of a rivet or an anchor bolt.

According to various embodiments, the at least one rigid plate may include at least one first insertion opening that assists in penetration or fastening of the at least one fixing tool.

According to various embodiments, the at least one heat dissipation plate may include, in a region corresponding to the at least one first insertion opening, at least one second insertion opening that assists in the penetration or fastening of the at least one fixing tool when the at least one heat dissipation plate and the at least one rigid plate are stacked.

According to various embodiments, the at least one second insertion opening may be formed in a region not overlapping the at least one solder.

According to various embodiments, at least one of the at least one first insertion opening or the at least one second insertion opening may include a screw thread on an inner surface thereof.

According to various embodiments, the at least one solder may include a plurality of solders.

According to various embodiments, the at least one second insertion opening may be included in a region between a first solder and a second solder on the same line that are included in the plurality of solders.

According to various embodiments, the at least one heat pipe may include a plurality of heat pipes.

According to various embodiments, the plurality of heat pipes may include a mutually corresponding shape and may be arranged adjacent to each other such that at least parts thereof are brought into contact with each other.

An electronic device according to the various embodiments described above may include a housing, a printed circuit board disposed in one region inside the housing, a processor mounted on one region of the printed circuit board, a shield can that shields at least part of the processor, and a heat dissipation structure that is disposed adjacent to the processor and that dissipates heat conducted from the processor. The heat dissipation structure may include at least one heat dissipation plate, at least one rigid plate that has an opening formed in one region thereof and that is bonded to an upper portion of the at least one heat dissipation plate to support durability of the at least one heat dissipation plate, at least one heat pipe, at least part of which is received in the opening formed by the at least one rigid plate, the at least one heat pipe being bonded with one region of the at least one heat dissipation plate that faces the at least one heat pipe, and at least one fixing tool that assists in fixing the at least one heat dissipation plate and the at least one rigid plate to each other.

According to various embodiments, the electronic device may further include a heat conduction member that has one region brought into contact with the processor and an opposite region brought into contact with the at least one heat pipe and that assists in heat conduction from the processor to the heat dissipation structure.

According to various embodiments, the heat dissipation structure may be disposed over the shield can.

According to various embodiments, the at least one heat dissipation plate may include a plurality of heat dissipation plates.

According to various embodiments, the plurality of heat dissipation plates may be spaced apart from each other by a specified distance to avoid overlapping the shield can.

According to various embodiments, the at least one heat dissipation plate may include, on one region thereof, at least one solder that assists in bonding the at least one heat dissipation plate with at least one of the at least one rigid plate or the at least one heat pipe.

According to various embodiments, the at least one rigid plate may include at least one first insertion opening that assists in penetration or fastening of the at least one fixing tool.

According to various embodiments, the at least one heat dissipation plate may include, in a region corresponding to the at least one first insertion opening, at least one second insertion opening that assists in the penetration or fastening of the at least one fixing tool when the at least one heat dissipation plate and the at least one rigid plate are stacked.

According to various embodiments, at least one of the at least one first insertion opening or the at least one second insertion opening may include a screw thread on an inner surface thereof.

According to various embodiments, the at least one fixing tool may include at least one of a rivet or an anchor bolt.

A heat dissipation structure according to the various embodiments described above may include at least one vapor chamber, at least one rigid plate bonded to an upper portion of the at least one vapor chamber to support durability of the at least one vapor chamber, and at least one fixing tool that assists in fixing the at least one vapor chamber and the at least one rigid plate to each other.

According to various embodiments, the at least one vapor chamber may include at least one third insertion opening that assists in penetration of the at least one fixing tool.

According to various embodiments, the at least one vapor chamber may include, on one region not overlapping the at least one third insertion opening, at least one solder that assists in bonding the at least one vapor chamber with the at least one rigid plate.

According to various embodiments, the at least one rigid plate may include, in a region corresponding to the at least one third insertion opening, at least one fourth insertion opening that assists in the penetration of the at least one fixing tool when the at least one rigid plate and the at least one vapor chamber are stacked.

According to various embodiments, the at least one fixing tool may include a welding rod.

According to various embodiments, the at least one fixing tool may at least partially bond the vapor chamber and the at least one rigid plate by being cooled after molten through a specified process.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
a housing;
a printed circuit board disposed in one region inside the housing;
a processor mounted on one region of the printed circuit board;
a shield can configured to shield at least part of the processor; and
a heat dissipation structure disposed adjacent to the processor and configured to dissipate heat conducted from the processor,
wherein the heat dissipation structure includes:
a plurality of heat dissipation reinforcement plates;
at least one rigid reinforcement plate having an opening formed in one region thereof, the at least one rigid reinforcement plate being bonded to an upper portion of the plurality of heat dissipation reinforcement plates to support durability of the plurality of heat dissipation reinforcement plates;
at least one heat pipe, at least part of which is received in the opening formed by the at least one rigid reinforcement plate, the at least one heat pipe being bonded with one region of the plurality of heat dissipation reinforcement plates configured to face the at least one heat pipe; and
at least one fixing tool configured to assist in fixing the plurality of heat dissipation reinforcement plates and the at least one rigid reinforcement plate to each other,
wherein the plurality of heat dissipation reinforcement plates are spaced apart from each other by a specified distance to avoid overlapping the shield can.

2. The electronic device of claim 1, further comprising:
a heat conduction member having one region brought into contact with the processor and an opposite region brought into contact with the at least one heat pipe, the heat conduction member being configured to assist in heat conduction from the processor to the heat dissipation structure.

3. The electronic device of claim 2, wherein the heat dissipation structure is disposed over the shield can.

4. The electronic device of claim 1, wherein the plurality of heat dissipation reinforcement plates include at least one solder configured to assist in bonding the plurality of heat dissipation reinforcement plates with at least one of the at least one rigid reinforcement plate or the at least one heat pipe.

5. The electronic device of claim 1, wherein the at least one rigid reinforcement plate includes the opening corresponding to a shape of the at least one heat pipe.

6. The electronic device of claim 1, wherein the heat pipe is disposed such that one region is received in the opening and an opposite region is supported by the rigid reinforcement plate.

7. The electronic device of claim 1, wherein the at least one fixing tool includes at least one of a rivet or an anchor bolt.

8. The electronic device of claim 4, wherein the at least one rigid reinforcement plate includes at least one first insertion opening configured to assist in penetration or fastening of the at least one fixing tool.

9. The electronic device of claim 8, wherein the plurality of heat dissipation reinforcement plates include, in a region corresponding to the at least one first insertion opening, at least one second insertion opening configured to assist in the penetration or fastening of the at least one fixing tool when the plurality of heat dissipation reinforcement plates and the at least one rigid reinforcement plate are stacked.

10. The electronic device of claim 9, wherein the at least one second insertion opening is formed in a region not overlapping the at least one solder.

11. The electronic device of claim 9, wherein at least one of the at least one first insertion opening or the at least one second insertion opening includes a screw thread on an inner surface thereof.

12. The electronic device of claim 1, wherein the at least one heat pipe includes a plurality of heat pipes, and
wherein the plurality of heat pipes include a mutually corresponding shape and are arranged adjacent to each other such that at least parts thereof are brought into contact with each other.

* * * * *